United States Patent
Benner et al.

(10) Patent No.: US 10,648,642 B2
(45) Date of Patent: *May 12, 2020

(54) LED APPARATUS EMPLOYING TUNABLE COLOR FILTERING USING MULTIPLE NEODYMIUM AND FLUORINE COMPOUNDS

(71) Applicant: CONSUMER LIGHTING (U.S.), LLC, Norwalk, CT (US)

(72) Inventors: Kevin Jeffrey Benner, Solon, OH (US); Gary Robert Allen, Chesterland, OH (US); Dengke Cai, Mentor, OH (US); Thomas Clynne, East Cleveland, OH (US); Jianmin He, Orange, OH (US)

(73) Assignee: Consumer Lighting (U.S.), LLC, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/966,329

(22) Filed: Dec. 11, 2015

(65) Prior Publication Data
US 2016/0097497 A1   Apr. 7, 2016

Related U.S. Application Data

(63) Continuation-in-part of application No. 14/876,366, filed on Oct. 6, 2015, and a continuation-in-part of
(Continued)

(51) Int. Cl.
*H01L 25/075* (2006.01)
*H01L 33/58* (2010.01)
(Continued)

(52) U.S. Cl.
CPC .................. *F21V 3/12* (2018.02); *F21K 9/64* (2016.08); *F21K 9/232* (2016.08); *F21K 9/233* (2016.08);
(Continued)

(58) Field of Classification Search
CPC ..... F21V 3/12; F21V 7/22; F21K 9/64; F21K 9/60; F21K 9/233; F21K 9/232;
(Continued)

(56) References Cited

U.S. PATENT DOCUMENTS

| 3,505,239 A | 4/1970 | Mazelsky et al. |
| 4,005,324 A | 1/1977 | Dolenga et al. |

(Continued)

FOREIGN PATENT DOCUMENTS

| CN | 101257014 | 9/2008 |
| CN | 107667247 | 2/2018 |

(Continued)

OTHER PUBLICATIONS

PCT Search Report and Written Opinion issued in connection with related PCT Application No. PCT/US2016/059974 dated Feb. 15, 2017.
(Continued)

*Primary Examiner* — Tracie Y Green
(74) *Attorney, Agent, or Firm* — Wood IP LLC

(57) ABSTRACT

The specification and drawings present a new apparatus such as a lighting apparatus, the apparatus comprising at least one LED (or OLED) module configured to generate a visible light such as white light, and at least one component such as an optical component comprising multiple (two or more) compounds, each containing neodymium (Nd) and at least one compound including fluorine (F) for imparting a desired color filtering effect to provide a desired light spectrum, where a color of the desired light spectrum in a color space is determined by relative amounts of the two or more compounds in the at least one component.

13 Claims, 12 Drawing Sheets

Related U.S. Application Data application No. PCT/CN2014/088116, filed on Oct. 8, 2014.

(60) Provisional application No. 62/061,129, filed on Oct. 7, 2014.

(51) Int. Cl.

| | |
|---|---|
| *H01L 33/60* | (2010.01) |
| *H01L 33/56* | (2010.01) |
| *F21K 99/00* | (2016.01) |
| *F21V 3/12* | (2018.01) |
| *F21K 9/64* | (2016.01) |
| *H01L 33/50* | (2010.01) |
| *F21V 7/22* | (2018.01) |
| *F21S 8/04* | (2006.01) |
| *F21K 9/232* | (2016.01) |
| *F21K 9/60* | (2016.01) |
| *F21K 9/233* | (2016.01) |
| *F21Y 115/10* | (2016.01) |

(52) U.S. Cl.
CPC . *F21K 9/60* (2016.08); *F21S 8/04* (2013.01); *F21V 7/22* (2013.01); *F21Y 2115/10* (2016.08); *H01L 33/507* (2013.01); *H01L 2224/48091* (2013.01); *H01L 2224/73265* (2013.01); *H01L 2224/8592* (2013.01)

(58) Field of Classification Search
CPC ......... F21Y 2115/10; H01L 2224/8592; H01L 2224/73265; H01L 2224/48091; H01L 33/507; F21S 8/04
See application file for complete search history.

(56) References Cited

U.S. PATENT DOCUMENTS

| | | | |
|---|---|---|---|
| 4,395,653 A | 7/1983 | Graff | |
| 4,441,046 A | 4/1984 | James | |
| 4,633,127 A | 12/1986 | Beurskens | |
| 5,252,887 A | 10/1993 | Reisman | |
| 6,940,101 B2 | 9/2005 | Yano et al. | |
| 7,184,203 B2 | 2/2007 | Burgener | |
| 8,389,958 B2 | 3/2013 | Vo-Dinh et al. | |
| 8,646,926 B2 | 2/2014 | Manabe et al. | |
| 2004/0219116 A1* | 11/2004 | Reynders | C09C 1/0015 424/63 |
| 2008/0203900 A1 | 8/2008 | Chen | |
| 2009/0180788 A1* | 7/2009 | Tamoto | G03G 5/043 399/48 |
| 2009/0302236 A1* | 12/2009 | Vogt | C09K 11/7705 250/461.1 |
| 2010/0320480 A1* | 12/2010 | Rapoport | H01L 33/50 257/88 |
| 2012/0155061 A1* | 6/2012 | Manabe | F21K 9/135 362/84 |
| 2014/0191653 A1 | 7/2014 | Edmond et al. | |
| 2014/0226335 A1 | 8/2014 | Menkara | |
| 2014/0257439 A1 | 9/2014 | Douglas | |
| 2014/0268794 A1* | 9/2014 | Donofrio | F21V 9/08 362/293 |
| 2015/0109758 A1 | 4/2015 | Allen et al. | |
| 2015/0188006 A1 | 7/2015 | Williams et al. | |
| 2015/0252953 A1* | 9/2015 | Progl | F21K 9/135 362/84 |
| 2015/0279651 A1 | 10/2015 | Reisman et al. | |
| 2016/0097496 A1* | 4/2016 | Allen | F21K 9/56 257/40 |
| 2018/0156420 A1 | 6/2018 | Dudik | |

FOREIGN PATENT DOCUMENTS

| | | |
|---|---|---|
| JP | 58-225148 A | 12/1983 |
| JP | 04194803 A | 7/1992 |
| JP | 51-56581 A | 5/2010 |
| JP | 51-58444 A | 10/2010 |
| WO | 2016089810 A1 | 6/2016 |
| WO | 2016195938 A1 | 12/2016 |

OTHER PUBLICATIONS

PCT Search Report and Written Opinion issued in connection with corresponding PCT Application No. PCT/US2016/065149 dated Feb. 27, 2017.

U.S. Final Office Action issued in connection with related U.S. Appl. No. 14/931,476 dated May 5, 2017.

First Office Action for Chinese Patent Appl. No. 201680072489.0, filed Dec. 6, 2016, dated May 17, 2019, 23 pages (12 Pages of English Translation + 11 Pages Official Copy).

Reben, Manuela, et al. "Nd3+-doped oxyfluoride glass ceramics optical fibre with SrF2 Nanocrystals." Optica Applicata 42.2, 2012.

U.S. Non-Final Office Action issued in connection with corresponding U.S. Appl. No. 14/931,476 dated Jul. 18, 2016.

* cited by examiner

LED APPARATUS EMPLOYING TUNABLE COLOR FILTERING USING MULTIPLE NEODYMIUM AND FLUORINE COMPOUNDS

CROSS-REFERENCE TO RELATED APPLICATIONS

This application is a continuation-in-part of copending, commonly owned U.S. patent application Ser. No. 14/876,366, filed 6 Oct. 2015, the teachings of which are incorporated herein by reference in their entirety. This application is a continuation-in-part of copending, commonly owned International Application PCT/CN2014/088116, filed 8 Oct. 2014, the teachings of which are incorporated herein by reference.

TECHNICAL FIELD

The invention generally relates to lighting applications and related technologies and more particularly but not exclusively, this invention relates to using multiple compounds comprising neodymium (Nd) and fluorine (F) for imparting a desired color filtering effect in an LED light apparatus.

BACKGROUND OF THE INVENTION

Light emitting diodes (LEDs), which, as used herein also encompasses organic LEDs (OLEDs), are solid-state semiconductor devices that convert electrical energy into electromagnetic radiation that includes visible light (wavelengths of about 400 to 750 nm). An LED typically comprises a chip (die) of a semiconducting material, doped with impurities to create a p-n junction. The LED chip is electrically connected to an anode and a cathode, all of which are often mounted within an LED package. In comparison to other lamps such as incandescent or fluorescent lamps, LEDs emit visible light is more directional in a narrower beam.

An OLED typically comprises at least one emissive electroluminescent layer (a film of organic semiconductor) situated between electrodes (at least one electrode being transparent). The electroluminescent layer emits light in response to an electric current flowing between electrodes.

LED/OLED light sources (lamps) provide a variety of advantages over traditional incandescent and fluorescent lamps, including but not limited to a longer life expectancy, higher energy efficiency, and full brightness without requiring time to warm up.

Despite the appeal of LED/OLED lighting in terms of efficiency, longevity, flexibility, and other favorable aspects, there remains a need for continuous improvement in the color properties of LED lighting, especially in white LED/OLED devices, for use in both general illumination and in display applications.

FIG. 1 is a perspective view of a conventional LED-based lighting apparatus 10 suitable for area lighting applications. The lighting apparatus (which may also be referred to as a "lighting unit" or "lamp") 10 includes a transparent or translucent cover or enclosure 12, a threaded base connector 14, and a housing or base 16 between the enclosure 12 and the connector 14.

A LED-based light source (not shown) which can be an LED array including multiple LED devices, is located at the lower end of the enclosure 12 and adjacent the base 16. Because LED devices emit visible light in narrow bands of wavelengths, for example, green, blue, red, etc., combinations of different LED devices are often employed in LED lamps to produce various light colors, including white light. Alternatively, light that appears substantially white may be generated by a combination of light from a blue LED and a phosphor (e.g., yttrium aluminum garnet: cerium, abbreviated as YAG:Ce) that converts at least some of the blue light of the blue LED to a different color; the combination of the converted light and the blue light can generate light that appears white or substantially white. The LED devices can be mounted on a carrier within the base 16, and can be encapsulated on the carrier with a protective cover comprising an index-matching material to enhance the efficiency of visible light extraction from the LED devices.

To promote the capability of the lighting apparatus 10 to emit visible light in a nearly omnidirectional manner, the enclosure 12 shown in FIG. 1 may be substantially spheroidal or ellipsoidal in shape. To further promote a nearly omnidirectional lighting capability, the enclosure 12 may include a material that enables the enclosure 12 to function as an optical diffuser. Materials employed to produce the diffuser may include polyamides (e.g., nylon), polycarbonate (PC), polypropylene (PP), or the like. These polymeric materials can also include $SiO_2$ to promote refraction of the light and thereby to achieve a white reflective appearance. The inner surface of the enclosure 12 may be provided with a coating (not shown) that contains a phosphor composition.

Though the use of combinations of different LED devices and/or phosphors can be utilized to promote the ability of LED lamps to produce a white light effect, other approaches are desirable as alternatives, or in addition thereto, to improve chromatic characteristics of the white light generated by the LED devices.

SUMMARY OF THE INVENTION

According to an aspect of the invention, an apparatus comprising: at least one light emitting diode (LED) module, configured to generate a visible light; and at least one component comprising two or more compounds, each comprising neodymium (Nd), and at least one compound of the two or more compounds further comprises fluorine (F), the at least one component being configured to provide a desired light spectrum by filtering the generated visible light using the two or more compounds, wherein a color of the desired light spectrum in a color space is determined by relative amounts of the two or more compounds in the at least one component.

According further to the aspect of the invention, the at least one compound of the two or more compounds may be neodymium fluoride ($NdF_3$). Further, at least one further compound of the two or more compounds may comprise neodymium oxide ($Nd_2O_3$). Still further, the two or more compounds may comprise $Nd^{3+}$ ions and $F^-$ ions.

According still further to the aspect of the invention, the color of the desired light spectrum in the color space may be varied within a predefined area in the color space defined at least by absorption vectors of the two or more compounds. Further, the predefined area in the color space may be limited to about twelve MacAdam ellipses (or the like).

According yet further still to the aspect of the invention, the at least one LED module may comprise an organic LED. Further, the apparatus may comprise an integrated circuit containing a plurality of LED modules with a corresponding plurality of components.

Yet still further according to the aspect of the invention, the at least one component may be an encapsulating layer deposited on a top of the at least one LED module. Further, the at least one component may comprise an additive selected from the group consisting of $TiO_2$, $SiO_2$ and $Al_2O_3$. to increase diffusivity of the two or more compounds in the at least one component. Still further, the encapsulating layer may be a low temperature glass, a polymer, a polymer precursor, a polycarbonate, a thermoplastic or thermoset polymer or resin, a silicone, or a silicone epoxy resin. Yet still further, the at least one component may further comprise a phosphor.

Still yet further according to the aspect of the invention, the at least one component may be an encapsulating layer deposited on a further encapsulating layer comprising a phosphor, the further encapsulating layer being deposited on a top of the at least one LED module.

Still further still according to the aspect of the invention, the at least one compound of the two or more compounds may comprise one or more of Nd—F and Nd—X—F compounds, wherein X is one or more of elements O, N, S, Cl, OH, Na, K. Al, Mg, Li, Ca, Sr, Ba and Y.

Still further still according to the aspect of the invention, the at least one component may be an optical component comprising a transparent, translucent or reflective substrate with a coating on a surface of the substrate, the coating comprising the two or more compounds to provide the desired light spectrum by filtering the generated visible light. Further, a thickness of the coating may be in a range from about 50 nm to about 1000 microns. Still further, the coating may further comprise an additive having a higher refractive index than the two or more compounds, and wherein the additive is selected from metal oxides and non-metal oxides including at least $TiO_2$, $SiO_2$ and $Al_2O_3$. Yet still further, the coating may be disposed on an inner surface of the substrate. Further still, the substrate may be a diffuser being selected from the group consisting of a bulb, a lens, and a dome enclosing the at least one LED module.

According further still to the aspect of the invention, the at least one component may be deposited using injection molding or similar techniques.

BRIEF DESCRIPTION OF THE DRAWINGS

These and other features and aspects of the present disclosure will become better understood when the following detailed description is read with reference to the accompanying drawings, in which like characters represent like parts throughout the drawings, wherein.

DETAILED DESCRIPTION

Figure 1:
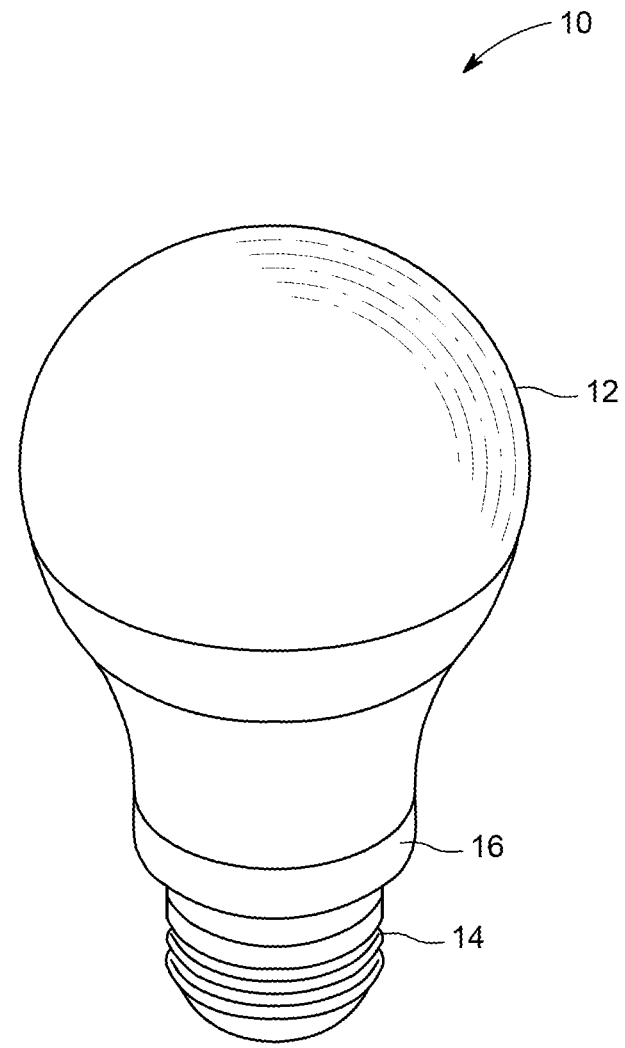
FIG. 1 is a perspective view of a conventional LED-based lighting apparatus.

A new apparatus such as a lighting apparatus is presented herein, the apparatus comprising at least one LED (or OLED) module configured to generate a visible light such as white light, and at least one component such as an optical component comprising multiple (two or more) compounds, each comprising neodymium (Nd) and at least one compound comprising fluorine (F) for imparting a desired color filtering effect to provide a desired light spectrum, where a color of the desired light spectrum in a color space is determined by relative amounts of the two or more compounds in the at least one component.

For example, according to one embodiment of the invention, the at least one component (optical component) may be a polymer base material (such as silicone, polycarbonate and the like) comprising two compounds: a first compound may be neodymium oxide ($Nd_2O_3$) and a second compound may be neodymium fluoride ($NdF_3$), as this case is described in detail herein. The neodymium compounds absorb yellow light in the 560-600 nm range, which alters the color point of the LED system. The addition of a single compound can move the color point along a line in the CIE 1931 color space (with chromaticity coordinates CCX and CCY). By using two or more compounds the color point can be moved anywhere within an area of the CIE color space (hereinafter "color space"). This allows for greater customization of the color of the LED system for a particular application as demonstrated in FIG. 3 herein.

In other words, the neodymium compounds (such as $Nd_2O_3$ and $NdF_3$ in the above example) can be added in various amounts to change the composition of the optical component for controlling the color point of the resulting light. The different absorption spectra of the two (or more) components result in movement of the color point of the LED system in different directions (i.e., in both CCX and CCY directions) when each component is added. Then color point movement vectors of the multiple compounds comprising Nd and F, described herein, can bound an area within the CIE color space, inside of which any color point can be achieved with the same LED, by varying the relative amounts of the two or more compounds, as described herein.

According to another embodiment, a scattering element, such as titania (TiO2), alumina (Al$_2$O$_3$), silica (SiO$_2$) or the like, may be added to the polymer base to increase the diffusivity of the multiple Nd and F compounds in the optical component. Variation of three variables (e.g., weight loading of TiO2, NdF3, and Nd$_2$O$_3$ for the above example) may allow creation of a wide variety of specialized optical components for achieving a desired light spectrum and distribution.

Moreover, according to one embodiment of the invention, at least one compound (or more than one) may comprise elements of neodymium (Nd) and fluorine (F), and optionally comprising one or more other elements. Typically such compound comprises Nd$^{3+}$ ions and F$^-$ ions. For the purpose of this invention, a "Nd—F compound" should be broadly construed to include compounds comprising neodymium and fluoride and optionally other elements.

According to a further embodiment, the component may include a composite/encapsulating layer on a surface of the LED (OLED) chip so that multiple compounds comprising Nd and F disclosed herein, can be blended (dispersed) in that encapsulating layer, e.g., along with a phosphor, to achieve favorable visible absorption profiles. The composite/encapsulating layer may be formed using a low temperature glass, a polymer (such as polycarbonate), a polymer precursor, a silicone (polymer) or silicone epoxy resin or precursor, and the like.

According to another embodiment, the optical component may be a transparent, translucent reflective or transflective (partially reflective and transmitting) substrate, and a coating on a surface of the substrate comprising multiple Nd and F components described herein, can apply a color filtering effect to the visible light, generated by the LED module, while it is passing through the optical component, e.g., to filter the visible light in the yellow light wavelength range, for example, for wavelengths from about 560 nm to about 600 nm to provide a desired light spectrum.

Furthermore, the transparent or translucent substrate of the optical component may be a diffuser, such as a bulb, a lens and an envelope enclosing at least one LED chip. Moreover, the substrate may be a reflective substrate, and the LED chip can be arranged outside of the substrate. The multi-compound coating (comprising Nd and F multiple compounds described herein) may be disposed on a surface of the substrate, and the thickness of the coating should be sufficient to achieve the color filtering effect. The thickness may typically be within a range from 50 nm to 1000 microns, with a preferred thickness being between 100 nm to 500 microns.

The resultant devices can exhibit improvement of light parameters using filtering with Nd and Nd—F compounds/materials having intrinsic absorption in the visible region between about 530 nm and 600 nm to enhance CSI (color saturation index), CRI (color rendering index), R9 (color rendering value) revealness (lighting preference index, LPI) and the like. R9 is defined as one of 6 saturated test colors not used in calculating CRI. The "revealness" is a parameter of the emitted light based on a version of the LPI, which is described in co-pending, commonly owned International application PCT/US2014/054868, filed Sep. 9, 2014 (published as WO2015/035425 on Mar. 12, 2015), and hereby incorporated by reference in pertinent part.

In one embodiment, at least one of the multiple compounds described herein may including Nd$^{3+}$ ions and F$^-$ ions and may be a Nd—F compound or a Nd—X—F compound. As used herein, the "Nd—F compound" should be broadly construed to include compounds including neodymium and fluoride and optionally other elements. Such compounds comprising neodymium and fluoride may comprise neodymium fluoride, or neodymium oxyfluoride (e.g., NdO$_x$F$_y$, where 2x+y=3, such as Nd$_4$O$_3$F$_6$) or neodymium fluoride comprising adventitious water and/or oxygen, or a neodymium hydroxide fluoride (e.g., Nd(OH)$_a$F$_b$, where a+b=3), or numerous other compounds comprising neodymium and fluoride which will be become readily apparent from the following description.

In some embodiments, one of the multiple compounds may be NdF3 or NdFO. For the Nd—X—F compound, X is at least one element selected from the group consisting of: elements that form compounds with neodymium, such as, oxygen, nitrogen, sulfur and chlorine, or at least one metallic element that form compounds with fluorine, such as Na, K, Al, Mg, Li, Ca, Sr, Ba, and Y, or combinations of such elements, said metallic elements being different from neodymium. Particular examples of Nd—X—F compounds may include: neodymium oxyfluoride (Nd—O—F) compounds; Nd—X—F compounds in which X may be Mg and Ca or may be Mg, Ca and O; as well as other compounds containing Nd—F, including perovskite structures doped with neodymium. Certain Nd—X—F compounds may advantageously enable broader absorption at wavelengths of about 580 nm.

Figure 2:
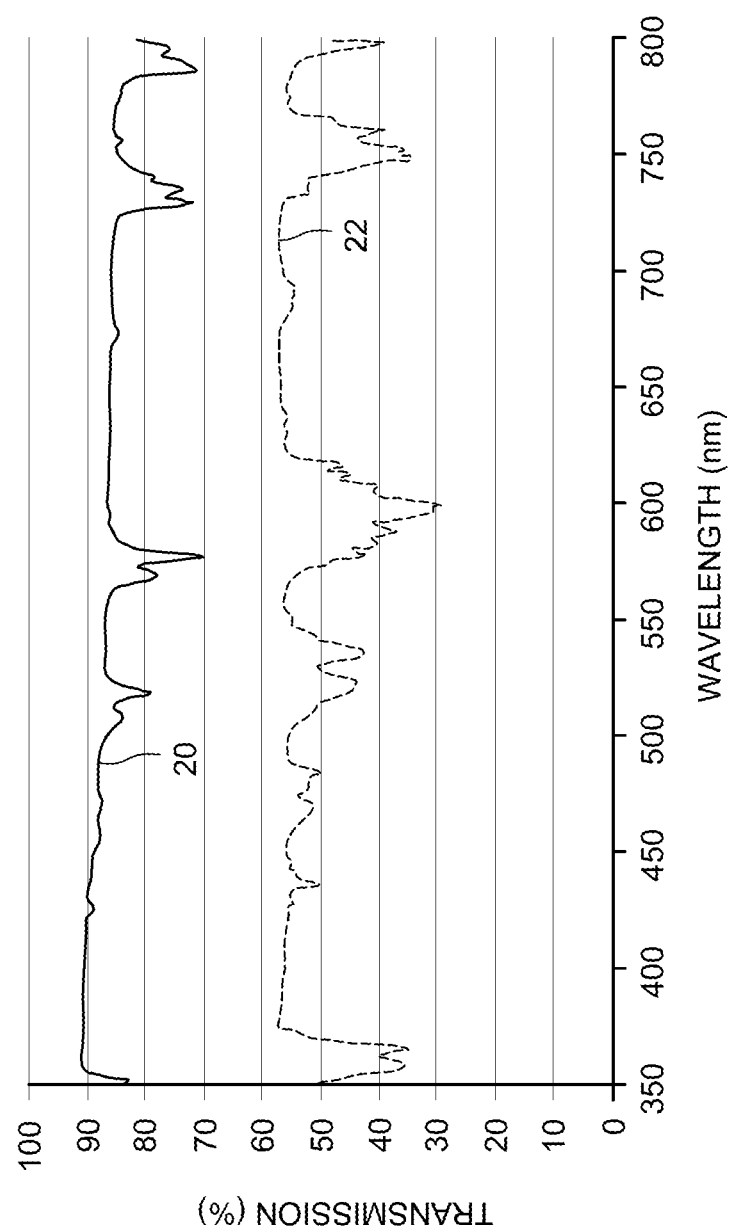
FIG. 2 is a graph of transmission in a visible spectrum of $Nd_2O_3$ and $NdF_3$.

As stated above, one component/optical component may be a polymer base material (such as silicone, polycarbonate and the like) comprising, for example, two compounds Nd$_2$O$_3$ and NdF$_3$. FIG. 2 is a graph of transmission in a visible spectrum of Nd$_2$O$_3$ (1.0% in 1.3 mm thick silicone having refractive index of 1.54) represented by a curve 22, and of NdF$_3$ (2.9% in 1.3 mm thick silicone having refractive index of 1.54) represented by a curve 20. It can be seen that the respective materials share many of the similar absorptive features, especially in the yellow (e.g., about 570 nm-about 600 nm) region. The different absorption peaks shown in FIG. 2 drive different color shift vectors of each component (Nd$_2$O$_3$ and NdF$_3$) in color space as further demonstrated in FIG. 3. By combining the two compounds, color points can be achieved that cannot be achieved with a single Nd compound or with Nd:glass (Nd$_2$O$_3$ in SiO$_2$).

In use, one may encapsulate an LED chip/die with an encapsulant (e.g., silicone, epoxy, acrylic, or the like); the encapsulant may comprise Nd$_2$O$_3$ and NdF$_3$ material or in general Nd and F based compounds as described herein, such that, e.g., Nd$_2$O$_3$ and NdF$_3$ in silicone can be deposited directly on the LED chip or on the array of LED chips (e.g., chip-on-board array, COB array) as further detailed herein.

Figure 3:
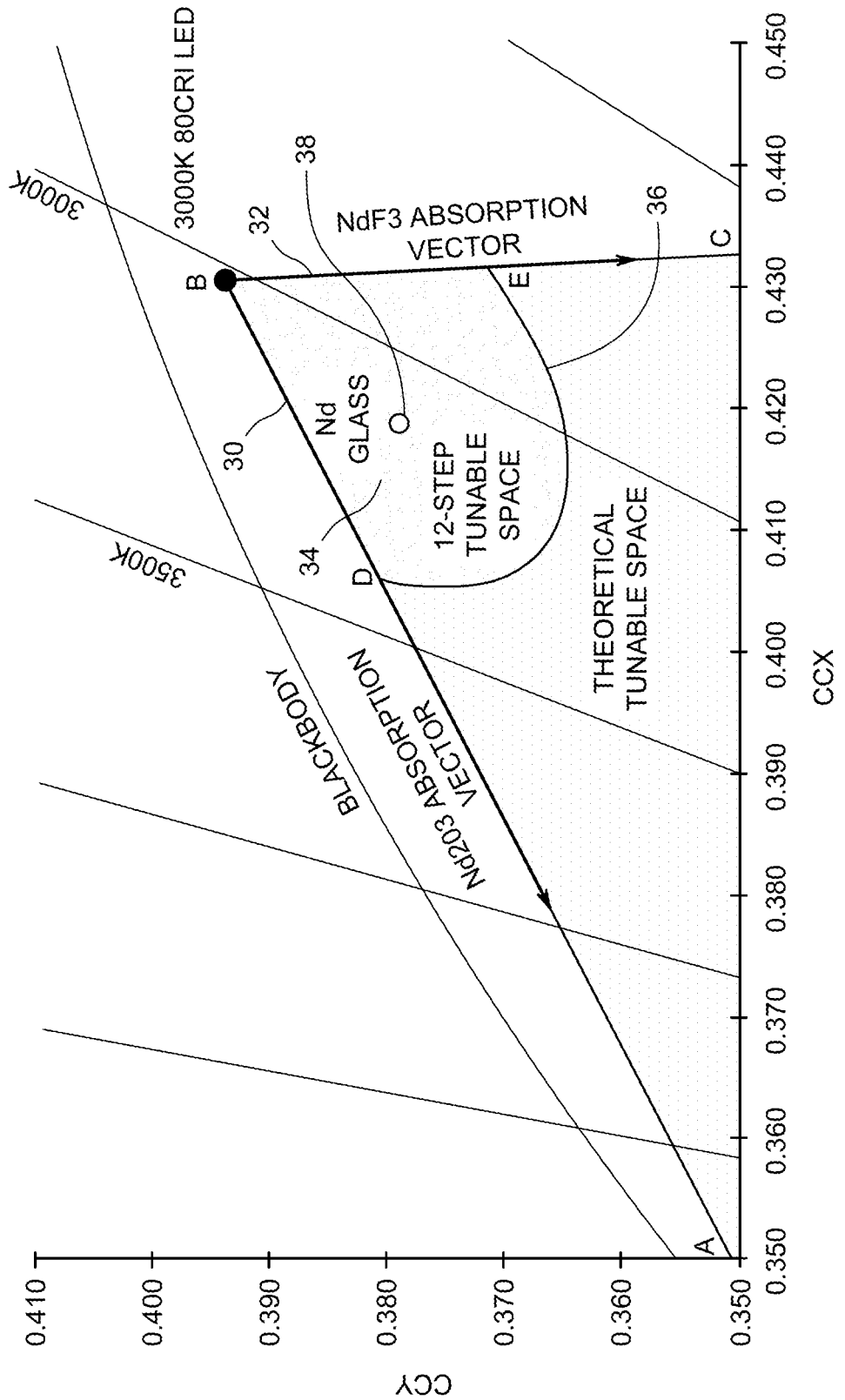
FIG. 3 is a color space diagram demonstrating how $Nd_2O_3$ and $NdF_3$ compounds blended into an optical component (such as silicone or polycarbonate) and deposited on a standard LED package (such as 80CRI with 3000K CCT) can shift a color point of the light source along vectors defined by the spectral absorption of the $Nd_2O_3$ and $NdF_3$ compounds.

FIG. 3 is a color space diagram demonstrating how Nd$_2$O$_3$ and NdF$_3$ compounds blended into an optical component (such as silicone or polycarbonate) and deposited on a standard LED package (such as 80CRI with 3000K CCT) can shift a color point of the light source along vectors 30 and 32 respectfully defined by the spectral absorption of the Nd$_2$O$_3$ and NdF$_3$ compounds.

Figure 4A:
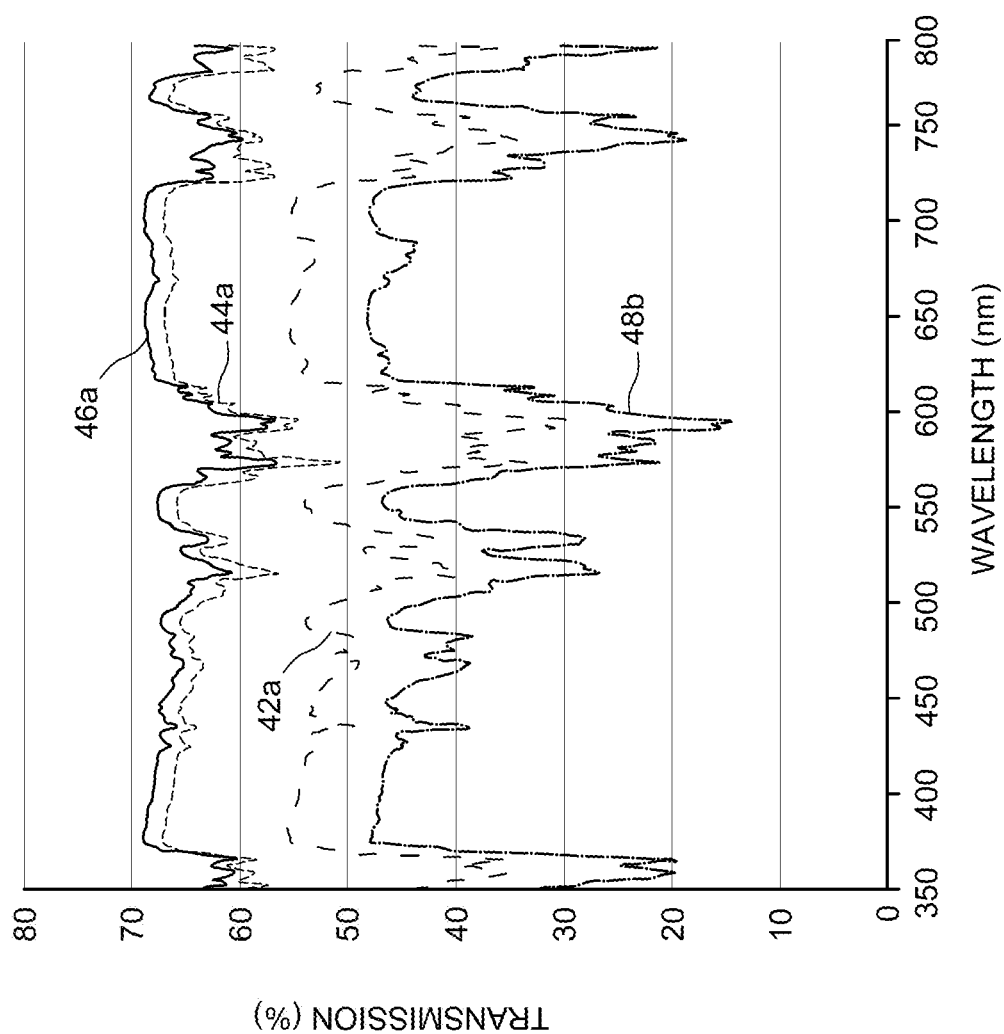
FIG. 4*a* is a graph of transmission in a visible spectrum of Nd compound mixes comprising different amounts of $Nd_2O_3$ and $NdF_3$ according to an embodiment of the invention.
Figure 4B:
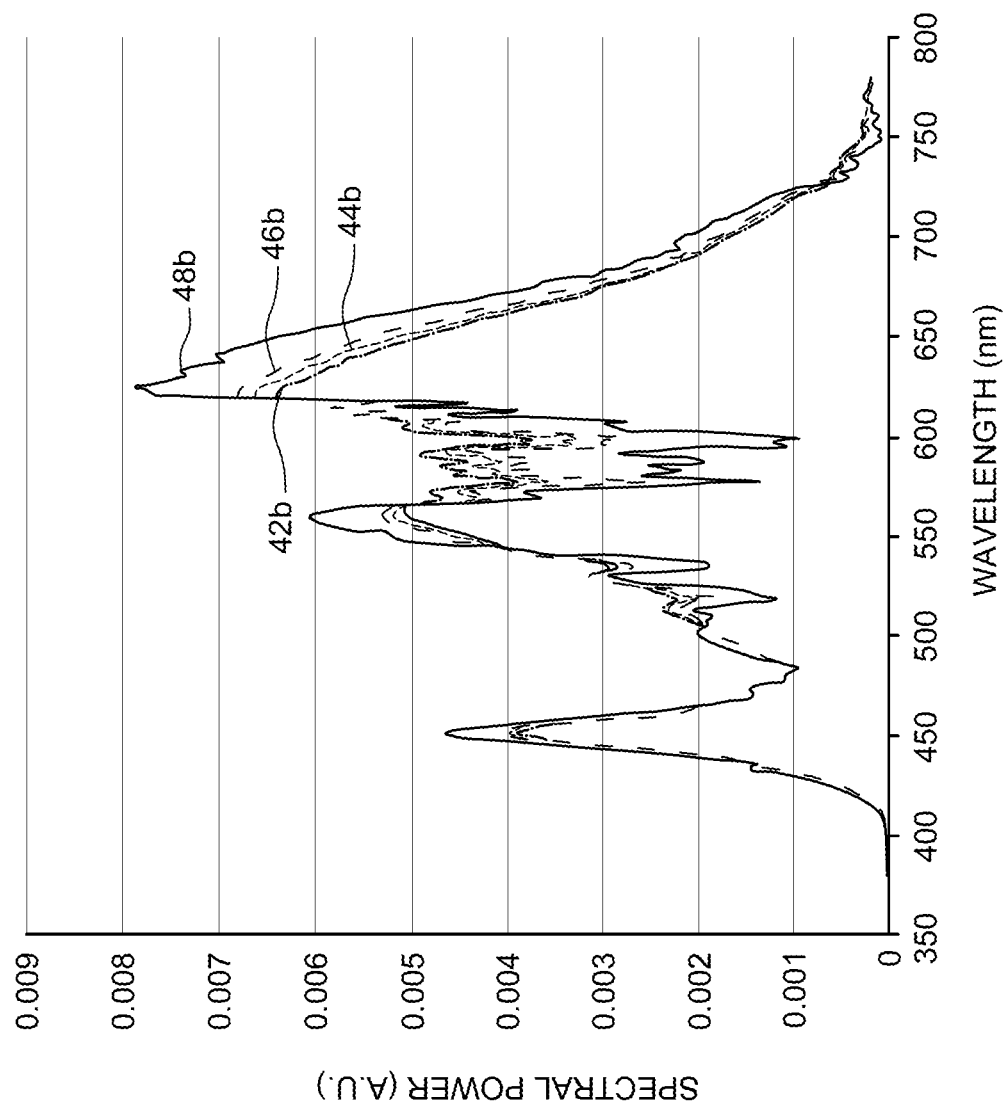
FIG. 4*b* is a graph of simulated emission of lamps (such as LED lamps) in a visible spectrum utilizing filters with various Nd compound mixes shown in FIG. 4*a* according to an embodiment of the invention.
Figure 5:
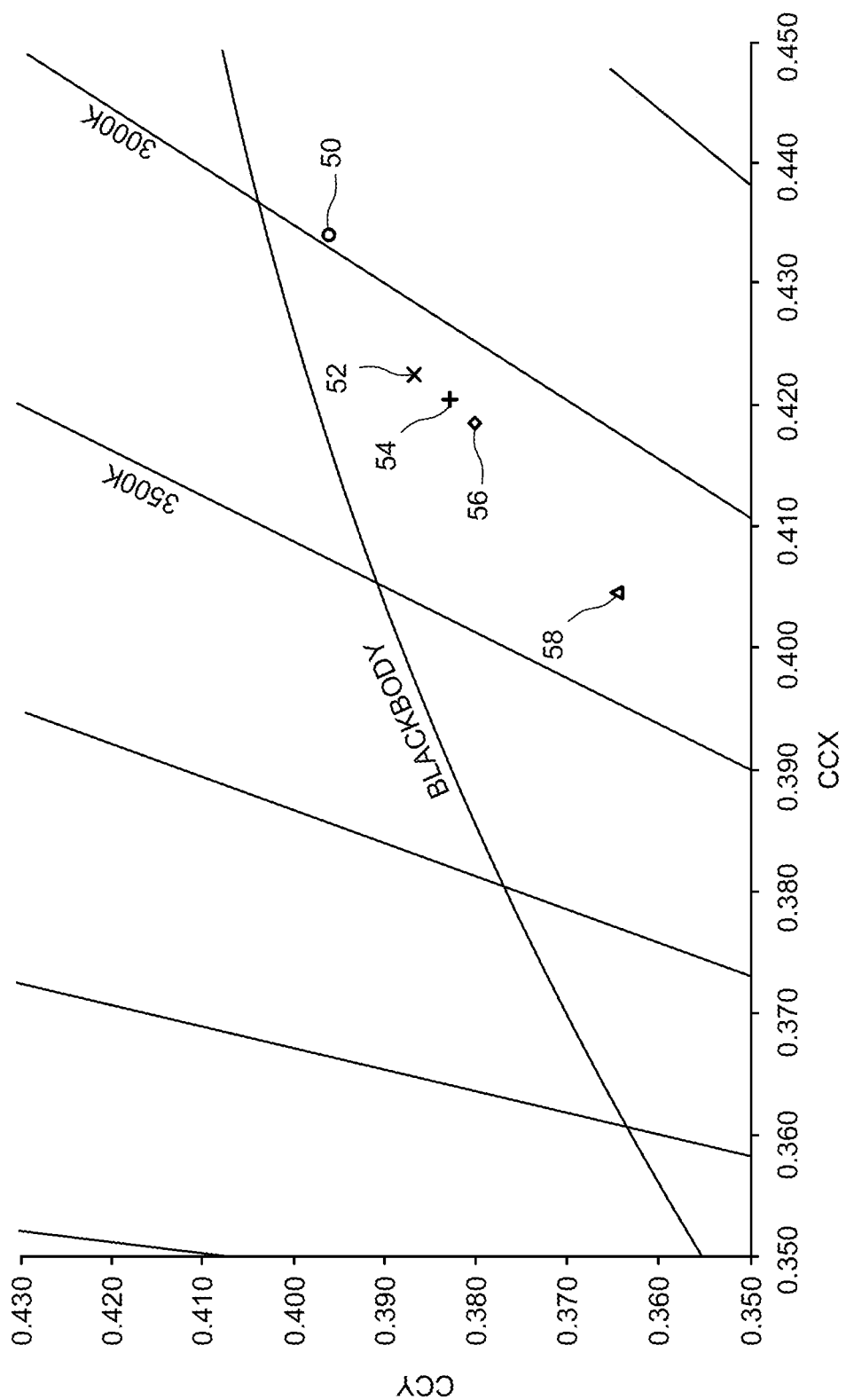
FIG. 5 is a color space diagram comparing color points of a standard 3000K LED lamp with simulated color points of LED lamps comprising filters with various Nd compound mixes shown respectively in FIGS. 4*a* and 4*b* according to an embodiment of the invention.

As it is clear from the diagram in FIG. 3, this system theoretically can allow any color point in a triangle ABC to be created from a standard 3000 K LED by varying relevant amounts of Nd$_2$O$_3$ and NdF$_3$ compounds, i.e., shifting color point of emitter along vectors 30 and 32 defined by the spectral absorption of the Nd$_2$O$_3$ and NdF$_3$ compounds respectively. However, since large energy losses due to high filtering are undesirable, this system may be practically limited to a smaller area 34, for example 12 MacAdam ellipses, or arbitrarily chosen some other area size, based on the application and the end user's willingness to sacrifice LPW (lumen per watt) to achieve a color point very far from the starting color. The area 34 is confined by lines BD, BE and a curve 36. Any of the practical color points in the area 34 can be achieved over a wide range of relative amounts and diffusion levels of the $Nd_2O_3$ and $NdF_3$ compounds, allowing for application of a given color point in different LED systems which require different beam shaping characteristics of the optics. By comparison, the addition of the Nd glass (conventional method) allows movement of the color point only to a single point 38 (or along a vector if the thickness of the glass is varied). FIGS. 4a, 4b and 5 demonstrate further examples for practicing embodiments disclosed herein.

FIG. 4a is an exemplary graph of transmission in a visible spectrum of Nd compound mixes comprising different amounts of $Nd_2O_3$ and $NdF_3$ in a silicone tape according to an embodiment of the invention. A curve 42a corresponds to 1.3 mm thick silicone tape comprising 4% of $NdF_3$ and 1% of $Nd_2O_3$, a curve 44a corresponds to 1.3 mm thick silicone tape comprising 5% of $NdF_3$ and 0.5% of $Nd_2O_3$, a curve 46a corresponds to 1.3 mm thick silicone tape comprising 3.% of $NdF_3$ and 0.5% of $Nd_2O_3$, and a curve 48a corresponds to 1.3 mm thick silicone tape comprising 3.5% of $NdF_3$ and 1.8% of $Nd_2O_3$.

FIG. 4b is a graph of simulated emission of lamps (such as LED lamps) in a visible spectrum utilizing filters with various Nd compound mixes shown in FIG. 4a according to the embodiment of the invention. In FIG. 4b a curve 42b is for simulated LED lamp with the 1.3 mm thick silicone tape comprising 4% of $NdF_3$ and 1% of $Nd_2O_3$, a curve 44b is for simulated LED lamp with the 1.3 mm thick silicone tape comprising 5% of $NdF_3$ and 0.5% of $Nd_2O_3$, a curve 46b is for simulated LED lamp with the 1.3 mm thick silicone tape comprising 3% of $NdF_3$ and 0.5% of $Nd_2O_3$, and a curve 48b is for simulated LED lamp with the 1.3 mm thick silicone tape comprising 3.5% of $NdF_3$ and 1.8% of $Nd_2O_3$.

FIG. 5 is a color space diagram comparing color points of a standard 3000K LED lamp with color points of LED lamps comprising filters with various Nd compound mixes shown respectively in FIGS. 4a and 4b according to the embodiment of the invention. In FIG. 5 a color point 52 is for simulated LED lamp with the 1.3 mm thick silicone tape comprising 4% of $NdF_3$ and 1% of $Nd_2O_3$, a color point 54 is for simulated LED lamp with the 1.3 mm thick silicone tape comprising 5% of $NdF_3$ and 0.5% of $Nd_2O_3$, a color point 56 is for simulated LED lamp with the 1.3 mm thick silicone tape comprising 3% of $NdF_3$ and 0.5% of $Nd_2O_3$, and a color point 58 is for simulated LED lamp with the 1.3 mm thick silicone tape comprising 3.5% of $NdF_3$ and 1.8% of $Nd_2O_3$.

FIGS. 4a, 4b and 5 demonstrate how changing relative amounts of $NdF_3$ and $Nd_2O_3$ in a filtering component of an (LED) lamp can modify a color temperature of the lamp and modify its emission spectrum (e.g., an absorption peak around 570-600 nm wavelength range) to provide a desired lamp spectrum (e.g., "whitening" of the light source") with the desired color temperature, and an adequate level of the transmitted lumen power, to be able to further improve other light parameters such as CSI, CRI, R9 and revealness. The "revealness" is a parameter of the emitted light based on a version of the LPI, which is described in co-pending, commonly owned International application PCT/US2014/054868, filed Sep. 9, 2014 (published as WO2015/035425 on Mar. 12, 2015), and hereby incorporated by reference in pertinent part.

In a further embodiment, the multiple Nd and F compounds of corresponding relative amounts may be blended into an encapsulating material along with one or more luminescent materials, such as phosphors. For example, the Nd and F multiple compounds of corresponding relative amounts may be blended with a yellow-green phosphor and/or a red phosphor. For example, the multiple Nd and F compounds may be blended with a Ce-doped YAG phosphor and/or a conventional red nitride phosphor, such as a $Eu^{2+}$-doped CaAlSiN red phosphor. In another example, the Nd and F multiple compounds can be blended with YAG:Ce phosphor and a red nitride phosphor in silicone, encapsulating a blue/ultraviolet-emitting LED.

FIGS. 6a-6d demonstrate different non-limiting examples of a LED-based lighting apparatus 60a, 60b, 60c and 60d respectfully, incorporating the Nd and F multiple compounds, as described herein, along with the phosphor to achieve favorable visible absorption/generation characteristics, according to various embodiments of the invention. In FIGS. 6a-6d the LED-based lighting apparatus 60a, 60b, 60c or 60d includes a dome 62 that can be an optically transparent or translucent substrate enclosing an LED chip 65 mounted on a printed circuit board (PCB) 66. Leads provide current to the LED chip 65, thus causing it to emit radiation. The LED chip may be any semiconductor light source, especially a blue or ultraviolet light source that is capable of producing white light when its emitted radiation is directed onto the phosphor. In particular, the semiconductor light source may be a blue/ultraviolet (UV) emitting LED based on a nitride compound semiconductor generalized as $In_iGa_jAl_kN$, where i, j and k are integers each having a value one or zero (include for example InGaN, AlN, AlGaN, AlGaInN device structures) having an emission wavelength greater than about 200 nm and less than about 550 nm. More particularly, the chip may be a near-UV or blue emitting LED having a peak emission wavelength from about 400 to about 500 nm. Even more particularly, the chip may be a blue emitting LED having a peak emission wavelength in a range about 440-460 nm. Such LED semiconductors are known in the art.

Figure 6A:
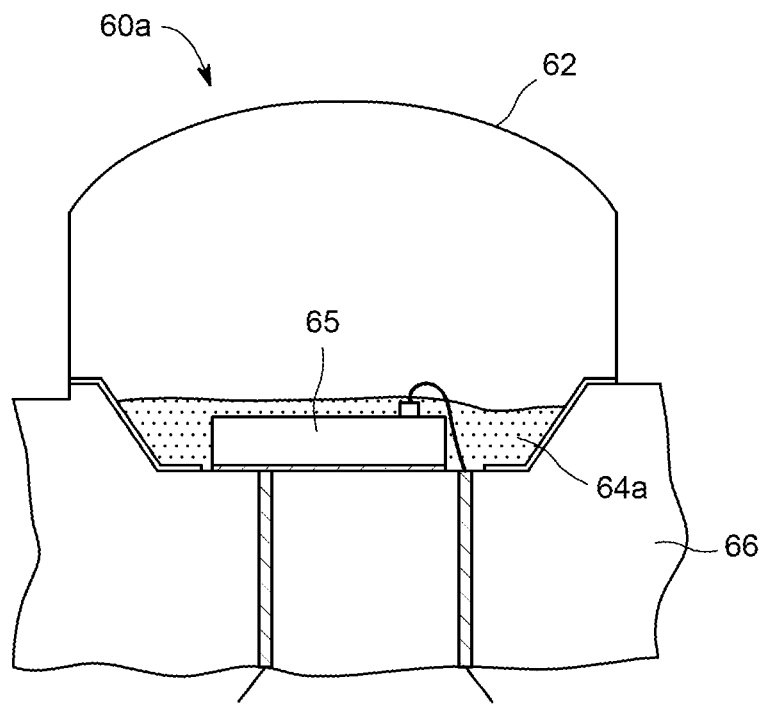
FIGS. 6*a*-6*d* are non-limiting examples of a LED-based lighting apparatus, incorporating a ND-F compound (or more generally Nd—X—F compound as described herein) along with a phosphor to impart favorable visible absorption/generation characteristics according to various embodiments of the invention.

According to one embodiment shown in FIG. 6a, a polymer composite layer (encapsulant compound) 64a can comprise the Nd and F multiple compounds, as described herein, blended with a phosphor to impart favorable visible absorption/generation characteristics according to various embodiments described herein. This compound layer 64a can be disposed directly on a surface of the LED chip 65 and radiationally coupled to the chip. "Radiationally coupled" means that radiation from the LED chip is transmitted to the phosphor, and the phosphor emits radiation of a different wavelength. In a particular embodiment, the LED chip 65 may be a blue LED, and the polymer composite layer can include a blend of the multiple Nd and F compounds of corresponding relative amounts with a yellow-green phosphor such as a cerium-doped yttrium aluminum garnet, Ce:YAG. The blue light emitted by the LED chip mixes with the yellow-green light emitted by the phosphors of polymer composite layer, and the net emission appears as white light which is filtered by the Nd and F multiple compounds. Thus LED chip 65 may be enclosed by the encapsulant material layer 64a. The encapsulant material may be a low-temperature glass, a thermoplastic or thermoset polymer or resin, or a silicone or epoxy resin. The LED chip 65 and the encapsulant material layer 64a may be encapsulated within a shell (restricted by the dome 62). Alternatively, the LED apparatus 60a may only include the encapsulant layer 64a without the outer shell/dome 62. In addition, scattering particles may be embedded in the encapsulant material to increase diffusivity of the Nd and F multiple compounds, as described herein. The scattering particles may be, for example, alumina ($Al_2O_3$), silica ($SiO_2$) or titania ($TiO_2$). Also, the scattering particles can effectively scatter the directional light emitted from the LED chip, preferably with a negligible amount of absorption.

To form a polymer composite layer that includes the multiple Nd and F compounds of corresponding relative amounts, described herein, on a surface of an LED chip, the particles may be dispersed in a polymer or polymer precursor, particularly a silicone, polycarbonate, silicone epoxy resin, or precursors therefor. Such materials are well known for LED packaging. The dispersion mixture can be coated on the chip by any suitable process, for example using injection molding (or casting and extruding the optical component or similar techniques), and particles having a larger density or particle size, or a larger density and larger particle size, preferentially settle in the region proximate the LED chip, forming a layer having a graded composition. Settling may occur during the coating or curing of the polymer or precursor, and may be facilitated by a centrifuging process, as known in the art. It is further noted that the parameters of dispersion of the phosphor and the Nd and F multiple compounds, e.g., including particle density and size and process parameters, can be chosen to provide the phosphor material being closer to the LED chip 65 than the Nd and F multiple compounds, in order to provide an appropriate filtering by the Nd and F multiple compounds of the light generated by the phosphor component.

Figure 6B:
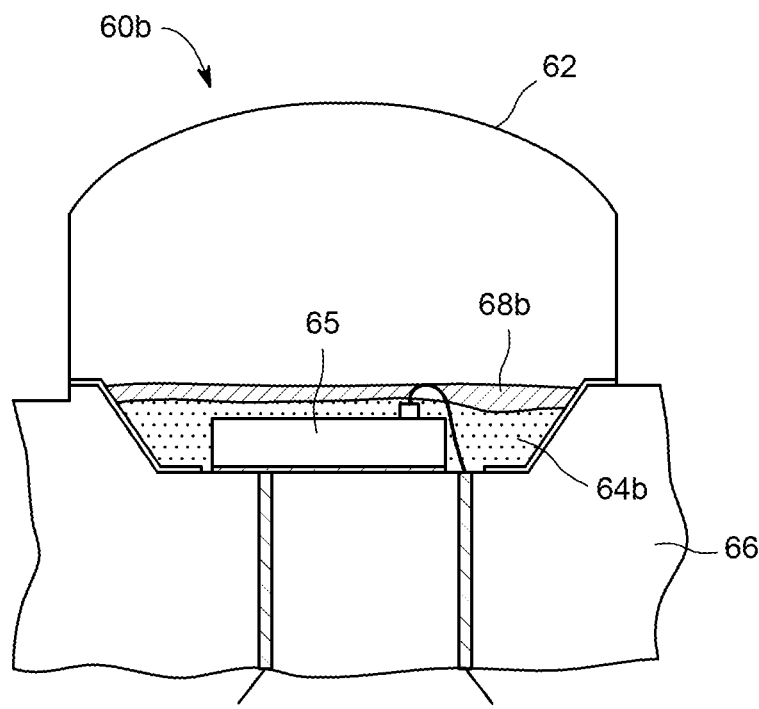

In an alternative exemplary embodiment shown in FIG. 6b, the phosphor layer 64b may be a conventionally fabricated encapsulant layer, and a separate encapsulant layer 68b with the Nd and F multiple compounds may be deposited on top of the phosphor layer 64b, e.g., using the appropriate conventional deposition/particle dispersion technique in a polymer or polymer precursor.

Figure 6C:
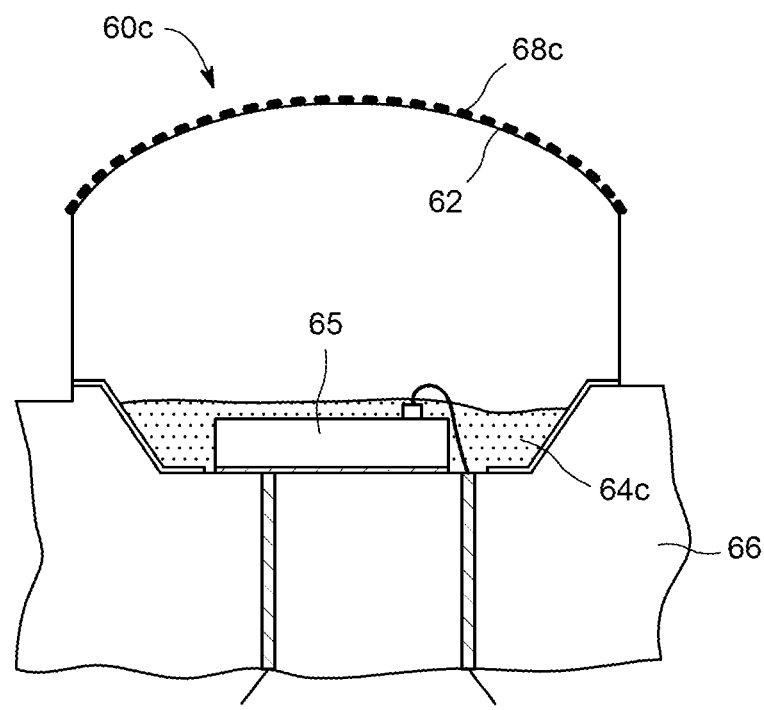

In a further exemplary embodiment shown in FIG. 6c, a composite layer 68c comprising the Nd and F multiple compounds can be coated on an outer surface of the dome (shell) 62. The performance of the coated layer 68b is similar to the performance of the encapsulant layer 68b with the Nd and F multiple compounds in FIG. 6b. Alternatively, the coating 68c in FIG. 6c can be deposited on an inner surface of the dome 62. More implementation details regarding coating of the dome/substrate will be discussed in reference to FIGS. 7-10. It is noted that the dome 62 itself can be transparent or translucent.

Figure 6D:
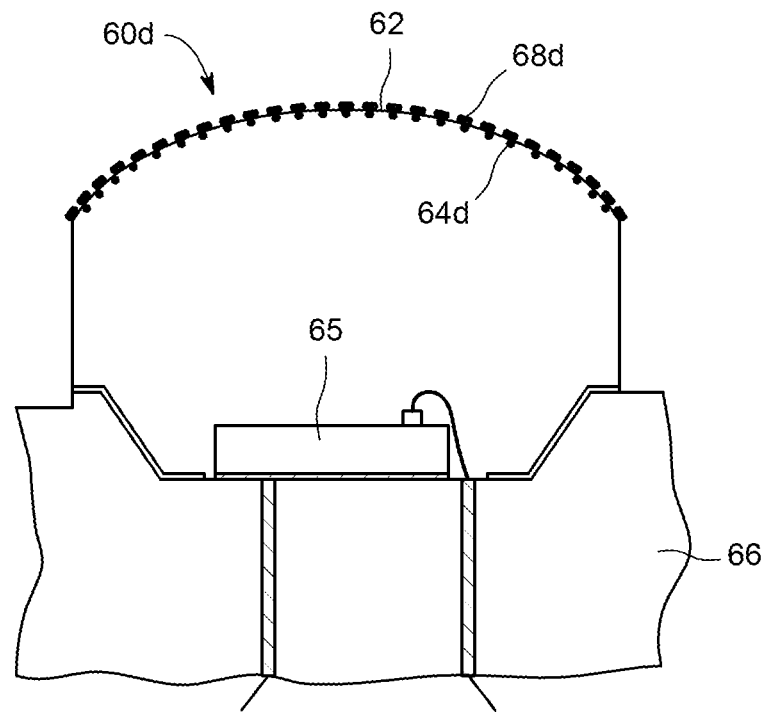

In yet a further exemplary embodiment, as shown in FIG. 6d, the dome (shell) 62 can be used to deposit multiple Nd and F compound composite layer/coating 68d on the outer surface of the dome 62 and a phosphor coating layer 64d on the inner surface of the dome 62. It is further noted that there may be different variations of this approach. For example, both coatings 64d and 68d may be deposited on one surface (outer or inner surface) of the dome 62 with the phosphor coating 64d being closer than the coating 68d to the LED chip 65. Also, coatings 64d and 68d (when deposited on one surface of the dome 62) can be combined in one layer similar to the encapsulant compound layer 64a in FIG. 6a. It is noted that the dome 62 itself can be transparent, translucent or transflective, in order to implement different variations of the example shown in FIG. 6d.

Below are several non-limiting examples of a LED-based lighting apparatus using the coating containing the Nd and F multiple compounds, described herein causing a desired color filter effect.

Figure 7:
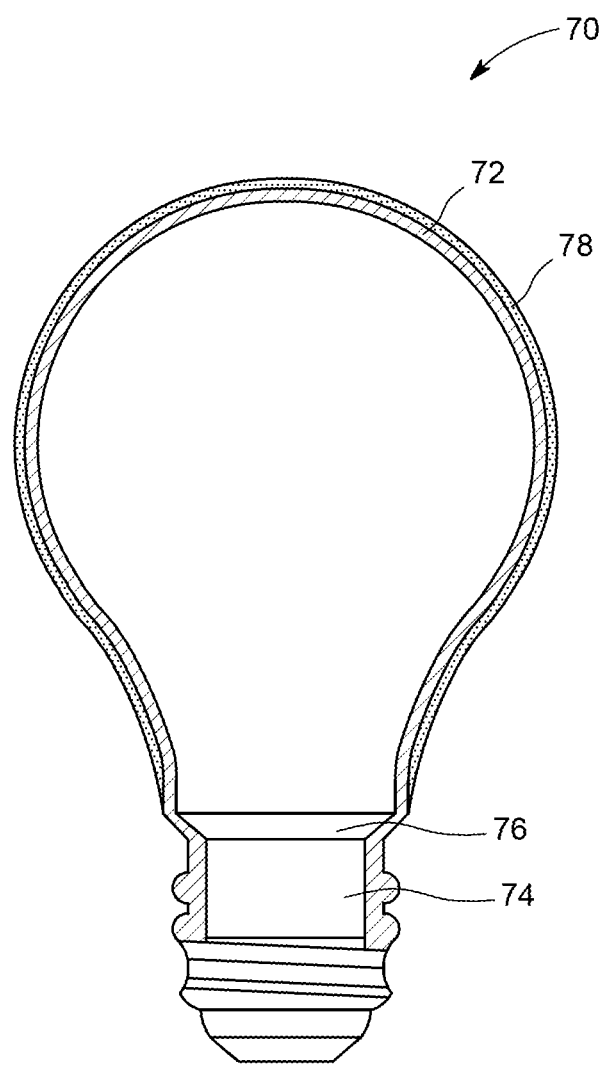
FIG. 7 is a cross-sectional view of a LED-based lighting apparatus in accordance with one embodiment of the invention.

FIG. 7 is a LED-based lighting apparatus suitable for area lighting applications in accordance with one embodiment of the invention. The LED-based lighting apparatus (which may also be referred to as a "lighting unit" or "lamp") is an LED lamp 70 configured to provide a nearly omnidirectional lighting capability. As shown in FIG. 7, the LED lamp 70 includes a bulb 72, a connector 74, and a base 76 between the bulb 72 and the connector 74, and a coating 78 on an outer surface of the bulb 72. The coating 78 includes the Nd and F multiple compounds described herein. In other embodiments, the bulb 72 can be replaced by other transparent or translucent substrates. Alternatively, the coating 78 may be coated on an inner surface of the bulb 72 which can be transparent or translucent.

Figure 8:
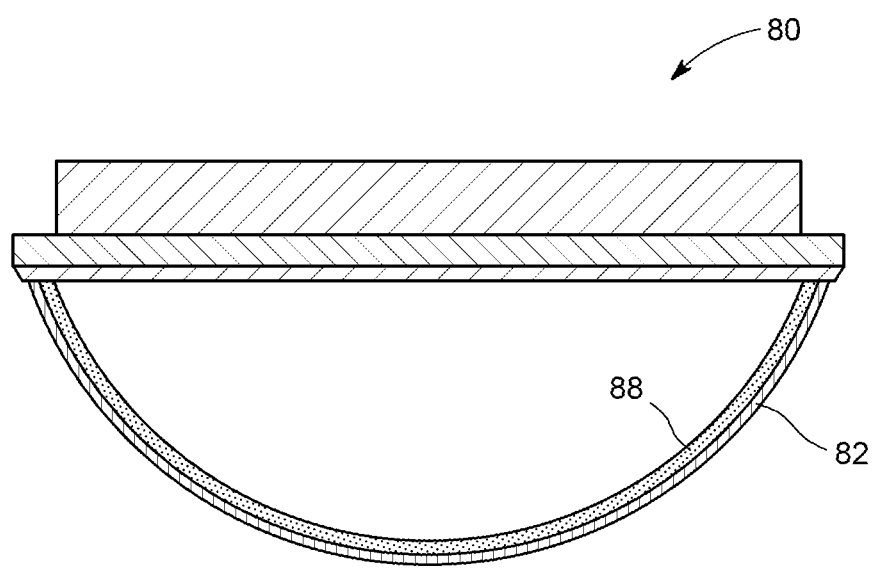
FIG. 8 is a cross-sectional view of a LED-based lighting apparatus in accordance with another embodiment of the invention.

FIG. 8 is a LED-based lighting apparatus 80 in accordance with a further embodiment of this invention. As shown in FIG. 8, the LED-based lighting apparatus is a ceiling lamp 80 (LED chip is not shown). The ceiling lamp 80 includes a hemispherical substrate 82 and a coating 88 containing the Nd and F multiple compounds described herein; the coating 88 is on an inner surface of the hemispherical substrate 82. Alternatively, the coating 88 may be coated on an outer surface of the hemispherical substrate 82 which can be transparent or translucent.

Figure 9:
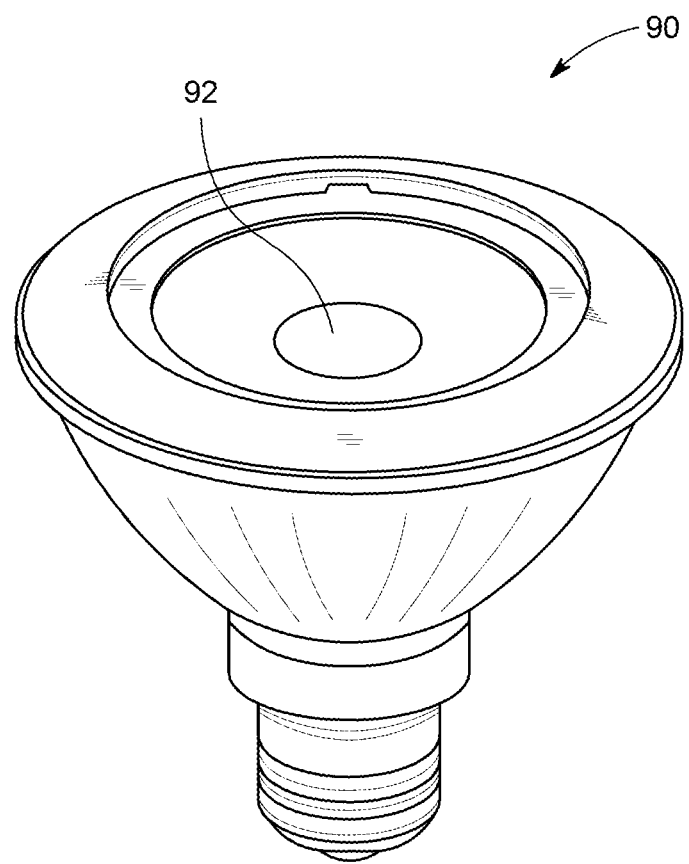
FIG. 9 is a perspective view of a LED-based lighting apparatus in accordance with a further embodiment of this invention.

FIG. 9 is a LED-based lighting apparatus in accordance with a further embodiment of this invention. As shown in FIG. 9, the LED-based lighting apparatus is a lens 90, and the lens 90 includes a flat substrate 92. In this embodiment, the flat substrate 92 includes the Nd and F multiple compound coating (not shown) on an outer surface thereof.

Figure 10:
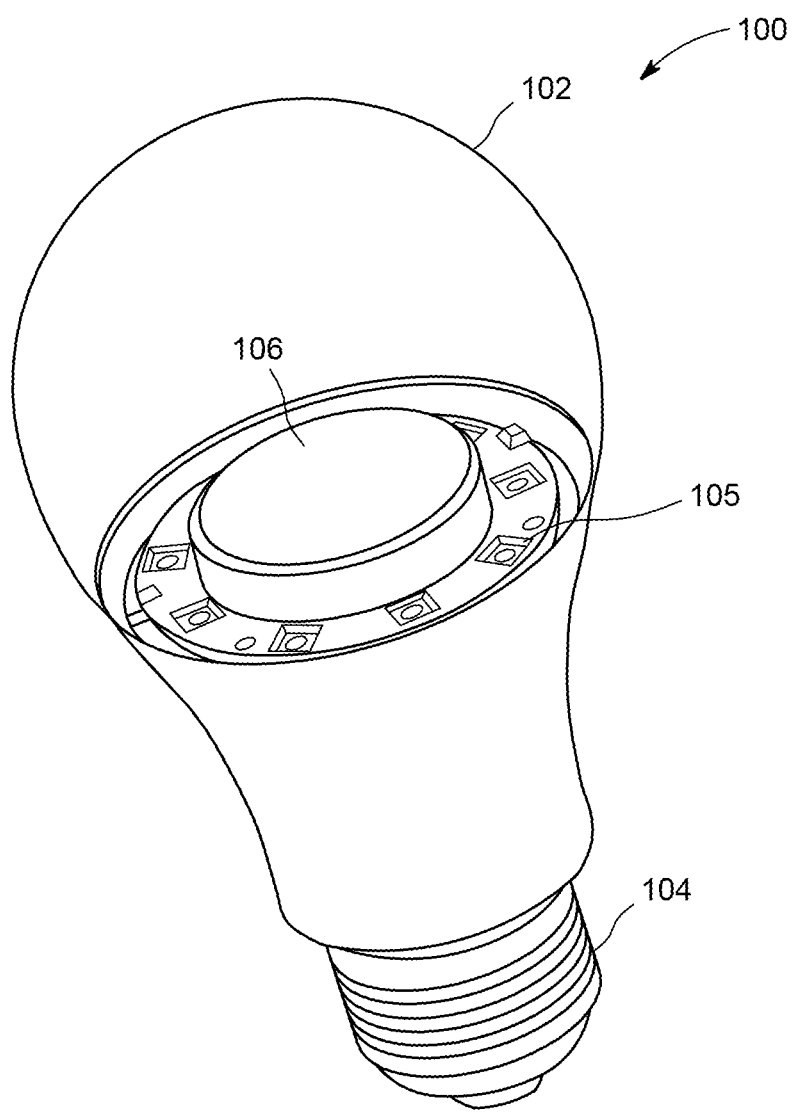
FIG. 10 is a perspective view of a LED-based lighting apparatus in accordance with one further embodiment of this invention.

FIG. 10 is a LED-based lighting apparatus 100 in accordance with one further embodiment of the invention. The LED-based lighting apparatus 100 includes a bulb 102, at least one LED chip 105 and a reflective substrate 106. The reflective substrate 106 is configured to reflect the visible light generated by the LED chip 105. In certain embodiments, the reflective substrate 106 includes the Nd and F multiple compound coating (not shown) on an outer surface thereof for providing the desired filtering. In FIG. 10 the dome (102) can be constructed of a diffusing material, so that a certain amount of light from the LEDs will pass through, and a certain amount will be reflected back into the cavity (these amounts depend on how highly diffusing the dome material is). The reflected light will either reflect specularly or diffusely, depending on the diffusivity of the dome 102. These diffuse and/or specular reflections from the dome 102 will be incident upon the reflective substrate 106 coated according to one of the embodiment described herein. Alternatively the dome 102 can be constructed from a broadband semi-reflective material to provide the same functionality.

The coating materials described herein, including a compound containing $Nd^{3+}$ ions and $F^-$ ions, may have little optical scattering (diffusion) effect; or, alternatively, may cause considerable optical scattering on light passing therethrough. To increase a scattering angle, the coating may include discrete particles of an organic or inorganic material. Alternatively, the organic or inorganic material can be solely made up of discrete particles of the Nd and F multiple compounds described herein, and/or made up of a mixture of discrete particles of the Nd and F multiple compounds and particles formed of at least one other different material.

In one embodiment, a suitable particle size for the organic or inorganic material can be from about 1 nm to about 10 microns. For the LED lamp 70 shown in FIG. 7, in order to maximize a scattering angle so that the LED lamp 70 could achieve omni-directional lighting, the particle size may be chosen to be much less than 300 nm to maximize efficiency of a Rayleigh scattering.

Although not intended to be limiting, the Nd and F multiple compound coating may be applied by, for example, spray coating, roller coating, meniscus or dip coating, stamping, screening, dispensing, rolling, brushing, bonding, electrostatic coating or any other method that can provide a coating of even thickness. The following will describe three non-limiting examples of how to provide the Nd and F multiple compound coating on the substrate.

In one embodiment, as shown in FIG. 7, the coating 37 may be coated on the bulb 72 by a bonding method. The LED lamp 70 can include a bonding layer (not shown) between the bulb 72 and the coating 78, and the bonding layer may include an organic adhesive or an inorganic adhesive. The organic adhesive can include an epoxy resin, an organic silicone adhesive, an acrylic resin, etc. The inorganic adhesive can include a silicate inorganic adhesive, a sulfate adhesive, a phosphate adhesive, an oxide adhesive, a boric acid salt adhesive etc.

In another embodiment, as shown in FIG. 7, the coating 78 may be coated on the outer surface of the bulb 72 by a spray-coating method. Firstly, a liquid mixture containing, for example, $Nd_2O_3$ and $NdF_3$ compounds of corresponding relative amounts, silicone dioxide, dispersant such as DISPEX A40, water and optionally $TiO_2$ or $Al_2O_3$ is formed. Subsequently, the formed liquid mixture is sprayed onto the bulb 72. Finally, the bulb 72 is cured to obtain the coated LED lamp 70.

In one embodiment, as shown in FIG. 7, the coating 78 may be coated onto the outer surface of the bulb 72 by an electrostatic coating method. Firstly, electrically charged powder consisting, for example, $Nd_2O_3$ and $NdF_3$ compounds of corresponding relative amounts, $SiO_2$ and $Al_2O_3$ is produced. Subsequently, the powder is coated onto the bulb 72 which is oppositely charged.

In another embodiment of the invention, both the spray coating method and the electrostatic coating method may use materials without organic solvent or organic compound, which can extend the service life of the LED light apparatus and avoid the discoloration typically caused by sulfonation.

In a further embodiment, to promote refraction of the light to achieve a white reflective appearance, the coating further may include an additive having a higher refractive index relative to the multiple Nd and F compounds. The additive can be selected from at least one of metal oxides or non-metal oxides, such as $TiO_2$, $SiO_2$ and $Al_2O_3$.

Unless defined otherwise, technical and scientific terms used herein have the same meaning as is commonly understood by one having ordinary skill in the art to which this disclosure belongs. The terms "first", "second", and the like, as used herein, do not denote any order, quantity, or importance, but rather are employed to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof, as well as additional items. The terms "connected" and "coupled" are not restricted to physical or mechanical connections or couplings, and can include electrical and optical connections or couplings, whether direct or indirect.

Furthermore, the skilled artisan will recognize the interchangeability of various features from different embodiments. The various features described, as well as other known equivalents for each feature, can be mixed and matched by one of ordinary skill in this art, to construct additional systems and techniques in accordance with principles of this disclosure.

In describing alternate embodiments of the apparatus claimed, specific terminology is employed for the sake of clarity. The invention, however, is not intended to be limited to the specific terminology so selected. Thus, it is to be understood that each specific element includes all technical equivalents that operate in a similar manner to accomplish similar functions.

It is to be understood that the foregoing description is intended to illustrate and not to limit the scope of the invention, which is defined by the scope of the appended claims. Other embodiments are within the scope of the following claims.

It is noted that various non-limiting embodiments described and claimed herein may be used separately, combined or selectively combined for specific applications.

Further, some of the various features of the above non-limiting embodiments may be used to advantage, without the corresponding use of other described features. The foregoing description should therefore be considered as merely illustrative of the principles, teachings and exemplary embodiments of this invention, and not in limitation thereof.

The invention claimed is:

1. An apparatus comprising:
   at least one light emitting diode (LED) module, configured to generate a visible light;
   a phosphor; and
   at least one component comprising two or more compounds, wherein at least one of the two or more compounds comprises $Nd_2O_3$, and wherein at least another one of the two or more compounds comprises a neodymium oxyfluoride having formula of $Nd_1O_xF_y$ where 2x+y=3 or a neodymium hydroxide fluoride having formula $Nd(OH)_aF_b$ where a+b=3,
   the at least one component being configured to provide a desired light spectrum by filtering the generated visible light using the two or more compounds,
   wherein a color of the desired light spectrum in a color space is determined by relative amounts of the two or more compounds in the at least one component, and
   wherein the at least one component-comprises more amount of the neodymium oxyfluoride having formula of $Nd_1O_xF_y$ where 2x+y=3 or the neodymium hydroxide fluoride having formula $Nd(OH)_aF_b$ where a+b=3 than the amount $Nd_2O_3$.

2. The apparatus of claim 1, wherein the color of the desired light spectrum in the color space is varied within a predefined area in the color space defined at least by absorption vectors of the two or more compounds.

3. The apparatus of claim 2, wherein the predefined area in the color space is limited to about twelve MacAdam ellipses.

4. The apparatus of claim 1, wherein the at least another one of the two or more compounds comprises $NdF_3$.

5. The apparatus of claim 1, wherein the at least one component is an encapsulating layer deposited on a top of the at least one LED module.

6. The apparatus of claim 5, wherein the encapsulating layer is a low temperature glass, a polymer, a polymer precursor, a polycarbonate, a thermoplastic or thermoset polymer or resin, a silicone, or a silicone epoxy resin.

7. The apparatus of claim 1, wherein the at least one component is an encapsulating layer deposited on a further encapsulating layer comprising a phosphor, the further encapsulating layer being deposited on a top of the at least one LED module.

8. The apparatus of claim 1, wherein the at least one component is an optical component comprising a transparent, translucent or reflective substrate with a coating on a surface of the substrate, the coating comprising the two or more compounds to provide the desired light spectrum by filtering the generated visible light.

9. The apparatus of claim 8, wherein a thickness of the coating is in a range from about 50 nm to about 1000 microns.

10. The apparatus of claim 1, wherein the at least one component or the phosphor further comprises an additive having a higher refractive index than the two or more compounds, and wherein the additive is selected from metal oxides and non-metal oxides including at least one of $TiO_2$, $SiO_2$ and $Al_2O_3$.

11. The apparatus of claim 8, wherein the substrate is a diffuser being selected from the group consisting of a bulb, a lens, and a dome enclosing the at least one LED module.

12. The apparatus of claim 1, wherein the apparatus comprises an integrated circuit containing a plurality of LED modules with a corresponding plurality of components.

13. The apparatus of claim 1, wherein the at least another one of the two or more compounds comprises the neodymium oxyfluoride.

\* \* \* \* \*